US011532999B2

(12) United States Patent
Leibl

(10) Patent No.: US 11,532,999 B2
(45) Date of Patent: Dec. 20, 2022

(54) ADAPTER DEVICE FOR BIDIRECTIONAL OPERATION

(71) Applicant: BRUSA HyPower AG, Sennwald (CH)

(72) Inventor: Michael Leibl, Altstätten SG (CH)

(73) Assignee: BRUSA HyPower AG, Sennwald (CH)

( * ) Notice: Subject to any disclaimer, the term of this patent is extended or adjusted under 35 U.S.C. 154(b) by 0 days.

(21) Appl. No.: 17/269,184

(22) PCT Filed: Aug. 27, 2019

(86) PCT No.: PCT/EP2019/072766
§ 371 (c)(1),
(2) Date: Feb. 17, 2021

(87) PCT Pub. No.: WO2020/043689
PCT Pub. Date: Mar. 5, 2020

(65) Prior Publication Data
US 2021/0320595 A1  Oct. 14, 2021

(30) Foreign Application Priority Data

Aug. 30, 2018  (DE) ...................... 10 2018 121 246.1

(51) Int. Cl.
*H02M 7/797* (2006.01)
*H02M 7/217* (2006.01)
(Continued)

(52) U.S. Cl.
CPC ......... *H02M 7/797* (2013.01); *H02M 1/4233* (2013.01); *H02M 1/4258* (2013.01);
(Continued)

(58) Field of Classification Search
CPC ...... H02M 7/797; H02M 1/42; H02M 1/4208; H02M 7/217–2173
See application file for complete search history.

(56) References Cited

U.S. PATENT DOCUMENTS 6,617,913 B1  9/2003  Johnson
9,093,917 B2  7/2015  Ho et al.
(Continued)

FOREIGN PATENT DOCUMENTS

CN  106685208 A  5/2017
CN  107078665 A  8/2017
(Continued)

OTHER PUBLICATIONS

Musavi, F., et al., "A Phase Shifted Semi-Bridgeless Boost Power Factor Corrected Converter for Plug in Hybrid Electric Vehicle Battery Chargers," In 2011 Twenty-Sixth Annual IEEE Applied Power Electronics Conference and Exposition (APEC), pp. 821-828, IEEE (Mar. 2011).
(Continued)

*Primary Examiner* — Sisay G Tiku
(74) *Attorney, Agent, or Firm* — Hoffmann & Baron, LLP

(57) ABSTRACT

An adapter device, including an AC connection including first AC contact and second AC contact; a DC connection including first DC contact and second DC contact; a first bridge branch including first switching device and second switching device, the first switching device and second switching device connected in series at a first bridge point, the first bridge point connected to first AC contact; a second bridge branch including third switching device and fourth switching device, third switching device and fourth switching device connected in series at a second bridge point, the second bridge point connected to second AC contact; and mode-setting device configured to predetermine a direction of power flow between AC connection and/or DC connection, first bridge branch and second bridge branch connected in parallel to the first DC contact and second DC contact, and different types of switching devices used as switching devices of a bridge branch.

8 Claims, 4 Drawing Sheets

(51) Int. Cl.
   *H02M 1/42*     (2007.01)
   *H02M 3/335*    (2006.01)
   *H02M 7/5387*   (2007.01)
   *H02M 7/539*    (2006.01)
   *H03K 17/0814*  (2006.01)
   *H02M 7/219*    (2006.01)
   *H02M 1/00*     (2006.01)

(52) U.S. Cl.
   CPC ....... *H02M 3/33584* (2013.01); *H02M 7/539* (2013.01); *H02M 7/5387* (2013.01); *H03K 17/08148* (2013.01); *H02M 1/007* (2021.05); *H02M 1/42* (2013.01); *H02M 1/4208* (2013.01); *H02M 7/217* (2013.01); *H02M 7/219* (2013.01); *H02M 7/2173* (2013.01)

(56) References Cited

U.S. PATENT DOCUMENTS

| | | | |
|---|---|---|---|
| 9,590,494 B1 | 3/2017 | Zhou et al. | |
| 2007/0029987 A1 | 2/2007 | Li | |
| 2009/0316457 A1* | 12/2009 | Friebe | H02M 1/44 363/131 |
| 2014/0009096 A1 | 1/2014 | Imanaka et al. | |
| 2015/0131343 A1 | 5/2015 | Hufnagel et al. | |
| 2015/0180325 A1* | 6/2015 | Liang | H02M 3/33546 363/21.09 |
| 2017/0117798 A1 | 4/2017 | Basler et al. | |
| 2017/0214314 A1 | 7/2017 | Jitaru et al. | |
| 2017/0244317 A1* | 8/2017 | Kondo | H02M 7/12 |
| 2018/0323701 A1 | 11/2018 | Sano et al. | |
| 2020/0324665 A1* | 10/2020 | Mackenzie | H02J 7/042 |

FOREIGN PATENT DOCUMENTS

| | | | | |
|---|---|---|---|---|
| CN | 108604869 A | | 9/2018 | |
| CN | 109951098 A | | 6/2019 | |
| CN | 111342685 A | * | 6/2020 | .......... H02M 1/4233 |
| DE | 102015118165 A1 | | 4/2017 | |
| EP | 2136465 A1 | | 12/2009 | |
| EP | 3220531 A1 | | 9/2017 | |
| FR | 3043862 A1 | * | 5/2017 | .......... B60L 11/1803 |
| JP | 2013-223357 A | | 10/2013 | |
| JP | 2017063568 A | * | 3/2017 | |
| JP | 6569839 B1 | * | 9/2019 | |
| WO | WO 00/72433 A1 | | 11/2000 | |
| WO | WO-2016129592 A1 | * | 8/2016 | .............. H02M 1/08 |
| WO | WO-2017078115 A1 | * | 5/2017 | .......... H02M 1/4208 |
| WO | WO-2021184921 A1 | * | 9/2021 | .............. F24F 11/88 |

OTHER PUBLICATIONS

Siu, Ken K.M., et al., "A Four-Quadrant Active Virtual Ground Rectifier by using Two High Frequency Switches", In: IECON 2017—43rd Annual Conference of the IEEE Industrial Electronics Society, 2017, pp. 533-538.

Vaculik, Petr, "The Properties of SiC in Comparison with Si Semiconductor Devices", In: 2013 International Conference on Applied Electronics, 2013, pp. 1-4.

English-language translation of the International Preliminary Report on Patentability issued in International Application No. PCT/EP2019/072766 dated Mar. 11, 2021.

English-language translation of Notice of First Office Action issued in Chinese Application No. 201980056801.0 dated Jun. 17, 2022.

\* cited by examiner

ADAPTER DEVICE FOR BIDIRECTIONAL OPERATION

CROSS-REFERENCE TO RELATED APPLICATIONS

The present application is the U.S. National Phase of PCT/EP2019/072766, filed on Aug. 27, 2019, which claims priority to German Patent Application No. 10 2018 121 246.1, filed on Aug. 30, 2018, the entire contents of which are incorporated herein by reference.

BACKGROUND

Field

The invention relates to the technical field of power transmission. In particular, the present invention relates to an adapter device for connecting an alternating current (AC) device and a direct current (DC) device, a method for operating the adapter device, an energy supply system, a means of transport, and the use of a power factor correction (PFC) device for bidirectional power transmission.

Related Art

A system for inductive energy transmission can be used to electrically charge a purely electric vehicle (EV) or a plug-in hybrid vehicle (PHEV) that is operated with a combination of fuel and electrical energy, if charging should be done in a contactless manner. However, a wired system can also be used. Both systems have in common that—especially in order to comply with limit values for electromagnetic emissions, for example—voltages and currents of different levels are used.

Powerful voltage converters that are operated on the AC grid and generate a DC voltage at the output must meet a number of internationally standardized regulations so that they do not interfere with the operation of other devices and do not impair the quality of the grid voltage. The requirement for a low harmonic content in the grid input current is a design criterion, especially for high outputs in the kW range, as is required, for example, for chargers for electric vehicles.

Ideally, a voltage converter on the grid behaves like a resistor, i.e., the current drawn from the grid is always proportional to the input voltage. If this is sinusoidal, which is usually the case, the drawn current is also purely sinusoidal and therefore does not contain any further harmonics.

However, in the case where the charging of an electrical energy storage device, for example, a capacitor, is directly involved by a grid rectifier, the current is drawn in short pulses and thus contains many harmonics.

To prevent this, a PFC circuit is usually connected between the rectifier and the capacitor. A PFC circuit is essentially a boost converter that is controlled in such a way that the current drawn from the grid runs like the grid voltage, i.e., is sinusoidal and has only a minimal phase shift.

Additional requirements apply to chargers in electric vehicles. They should be small, light, and robust and still supply the energy drawn from the grid to the battery without any losses. Electrical isolation between the grid and the battery for reasons of safety and electromagnetic compatibility (EMC) may be specified by regulations. In addition, as with all vehicle components—especially automotive components—cost pressure is very high.

Because of these conditions, options are being sought to dispense with the above-mentioned additional PFC stage or to provide it with additional functionality.

The U.S. Pat. No. 9,093,917 B1 and U.S. Pat. No. 9,590,494 B1, for example, describe various bridgeless PFC circuits.

The publication US 2007/0029987 shows a boost PFC circuit with a bridge rectifier.

SUMMARY

It may be seen as an object of the present invention to allow an effective transmission of energy.

Accordingly, an adapter device for connecting an AC device and a DC device, a method for operating the adapter device, an energy supply system, a means of transport, and the use of a PFC device for bidirectional power transmission are specified.

The subject matter of the invention is indicated by the features of the independent claims. Embodiments and further aspects of the invention are given from the dependent claims and the following description.

According to one aspect of the present invention, an adapter device for connecting an AC device and a DC device is specified, wherein the adapter device includes an AC connection, a DC connection, a first bridge branch, a second bridge branch and a mode-setting device. The first bridge branch has a first switching device and a second switching device, and the second bridge branch has a third switching device and a fourth switching device. The first switching device is connected in series to the second switching device at a first bridge point and the third switching device is connected in series to the fourth switching device at a second bridge point. In addition, the first bridge point is connected to a first AC contact of the AC connection and the second bridge point is connected to a second AC contact of the AC connection. In one example, the connection of the first bridge point to the first AC contact has a first inductance and the connection of the second bridge point to the first AC contact has a second inductance. The inductance may be a line inductance and/or a coil. The first bridge branch and the second bridge branch are connected in parallel to a first DC contact of the DC connection or to a second DC contact of the DC connection.

The mode-setting device is configured to predetermine the direction of power flow between the DC connection and/or the AC connection. For example, the mode-setting device may be switchable in a conventional PFC mode or rectifier mode in which the adapter device is operated as an AC-DC converter. In addition, the mode-setting device may be switchable, for example, into a feedback mode or inverter mode in which the adapter device is operated as a DC-AC converter.

Different types of switching devices may be used for the switching devices of a bridge branch. Omitting a switching device, in particular not fitting a switching device, may be interpreted as a permanently open switching device.

According to a further aspect of the present invention, a method for operating the adapter device according to the invention is specified. The method provides for the determination of a desired direction of power flow between the DC connection and/or the AC connection by means of a mode-setting device. When the desired direction of power flow is determined, an associated operating mode can be configured by means of the mode-setting device.

In order to predetermine the direction of power flow from the AC connection to the DC connection, a second switching device and a fourth switching device of the adapter device are switched on the basis of the negative potential of an alternating current applied to the AC connection in order to permanently connect the bridge point of the corresponding bridge branch belonging to the switching device to the second DC contact during the associated half-wave, i.e., without any interim interruption. In addition, the second switching device or the fourth switching device, which is not permanently switched during the half-wave, is operated with a clock pulse having a higher frequency than that of the alternating current applied to the AC connection.

In order to predetermine the direction of power flow from the DC connection to the AC connection, the first switching device and the third switching device of the adapter device are switched on the basis of the positive potential of an alternating current applied to the AC connection in order to permanently connect the bridge point of the corresponding bridge branch belonging to the switching device to the first DC contact during the associated half-wave. In addition, the second switching device or the fourth switching device, which is not permanently switched during the half-wave, is operated with a clock pulse having a higher frequency than that of the alternating current applied to the AC connection.

According to another aspect of the present invention, an energy supply system is provided having an AC source and/or an AC socket, at least one adapter device according to the invention and a DC source and/or a DC storage device. The AC source and/or the AC socket is connected to the AC connection of the adapter device and the DC source and/or the DC storage device is connected to the AC connection of the adapter device.

One or more phases of an AC grid may be usable as AC sources.

According to yet another aspect of the present invention, a means of transport is described as an adapter device according to the invention and/or an energy supply system according to the invention.

According to yet another aspect of the present invention, the use of a power factor correction device for bidirectional power transmission is specified. For example, an existing PFC device can be retrofitted for bidirectional operation by changing a control program and/or by providing a mode-setting device, which saves installation costs.

If the on-board charger of an electric vehicle should not only draw energy from the grid, but should also deliver alternating current to a load in inverse operation, a bidirectional PFC can be provided so that separate hardware components do not have to be provided for each direction of power propagation. Bidirectional operation can be desirable if, for example, on the one hand the battery of a vehicle is to be charged from an AC grid and, on the other hand, the battery is to operate external standard household appliances with a common household appliance plug and corresponding power supply, such as a refrigerator and/or a computer.

For bidirectional operation, the commonly used power switches such as Si-MOSFETs (silicon metal-oxide-semiconductor field-effect transistors) can only be operated "in reverse" to a limited extent in order to work as an AC source. The body diodes present in MOSFETs can result in undesired operating states due to the high reverse recovery delay of these diodes, which lead to the undesirable effects of high losses and strong electromagnetic interference.

The proposed adapter device according to the invention shows that reverse operation is possible without SiC-MOSFETs (silicon carbide MOSFETs), which are significantly more expensive than Si-MOSFETs and do not have the disadvantages described above. The adapter device according to the invention allows a PFC circuit constructed with Si-MOSFETs to be supplemented with at least two inexpensive IGBTs (insulated-gate bipolar transistors) in order to achieve the bidirectional function without additional disadvantages.

The mode-setting device can have several different configurations. For example, it can be provided as a physical switch, an electronic switch, and/or as software, and/or as a software register. The direction of the power flow can, however, also be recognized at the location of a load as the desired target of the power flow and the flow direction of the power can be adjusted accordingly.

In the case of grid operation, an input voltage may be specified by the grid. In free operation, in which the adapter device is to be used, for example, as an AC source, the voltage applied to the AC connection may be adjustable by the adapter device, for example, by means of the mode-setting device.

According to a further aspect of the present invention, the mode-setting device is configured to predetermine the direction of the power flow between the DC connection and/or the AC connection in that the mode-setting device controls the first switching device, the second switching device, the third switching device and the fourth switching device according to a predeterminable pattern. The control can be performed, for example, on the basis of a profile of a current profile and/or a voltage profile applied to the AC connection. For this purpose, for example, a sign of a sinusoidal current and/or voltage characteristic can be evaluated and the switching devices can be switched accordingly.

This predeterminable control pattern may allow a PFC circuit to be operated bidirectionally, in particular, if this PFC circuit uses Si-MOSFETs.

According to yet another aspect of the present invention, the type of switching device is selected from a group of types of switching devices. This group of types of switching devices consists of an electronic switch, a bipolar transistor, a silicon carbide MOSFET (SiC-MOSFET), an insulated-gate bipolar transistor (IGBT), an insulated-gate bipolar transistor (IGBT) with a silicon carbide diode (SiC diode) connected in anti-parallel and a silicon metal-oxide-semiconductor field-effect transistor (Si-MOSFET).

The use of corresponding types of components allows an inexpensive construction of an adapter device that can be operated bidirectionally.

According to a further aspect of the present invention, the different types of switching devices within a bridge branch differ in terms of their switch-off losses and/or their switching speed and/or in that the current is conducted by minority charge carriers (bipolar transistor, IGBT) or majority charge carriers (MOSFET, SiC Schottky diode). Compared to Si diodes, SiC diodes may, for example, offer the possibility of abruptly commutating the forward current by switching on the MOSFET without causing major disturbances and losses, so the extra cost may be saved elsewhere, e.g., with the EMC filter or cooling. Compared to Si diodes, essentially no or only a negligibly small reverse delay charge may have to be reduced in order to switch off the diode. In relation to a Si diode, a SiC diode may switch faster.

For example, for the first switching device of the first bridge branch and the third switching device of the first bridge branch, i.e., for the switching devices of a bridge branch that are connected to the first DC contact, for example a positive contact or "+" contact of the DC connection, an IGBT with a SiC diode connected in anti-parallel can be used. By contrast, a Si-MOSFET may be used for the second switching device of the first bridge branch and the fourth switching device of the second bridge branch. Consequently, the switching devices of a bridge branch that are connected to the second DC contact, for example, a negative contact or "−" contact of the DC connection, are designed as Si-MOSFETs.

However, an IGBT has higher switch-off losses—among other things because the current is conducted through minority charge carriers—compared to a Si-MOSFET—which may use the minority charge carriers to conduct current—so that switching devices with different switch-off losses are used within a bridge branch.

According to a further aspect of the present invention, the first AC contact of the AC connection and/or the second AC contact of the AC connection has/have a coil. In one example, the coil can be implemented as a line inductance.

A coil in the AC contacts and the two associated power switches form a boost converter and only allow the voltage to be boosted to a desired voltage in PFC mode. The coils can be designed essentially identically, but also can be designed differently. The symmetrical provision of the coils in the first AC connection and the second AC connection allows bridgeless operation, i.e., a rectifier bridge for rectifying the alternating current for conversion into a direct current is not necessary. A change in sign of the alternating current can be taken into account by activating the switching devices.

In one example, the coils of the first AC contact and the second AC contact may be magnetically coupled, for example, via a ferrite core. The coupling can be in the same direction or opposite directions. When designed as a common mode choke with high leakage inductance, an additional common mode filter effect may be found.

According to yet another aspect of the present invention, the mode-setting device is configured to predetermine the direction of power flow from the AC connection to the DC connection, and to predefine a first control pattern for the switching devices. This first control pattern provides that the second switching device and the fourth switching device are switched on the basis of the negative potential of an alternating current applied to the AC connection in order to permanently connect the bridge point of the corresponding bridge branch belonging to the switching device to the second DC connection during the associated half-wave, in particular, to switch through the corresponding switching device. In addition, the first control pattern provides that the second switching device or fourth switching device, which is not permanently switched during the half-wave, is operated with a clock pulse having a higher frequency than that of the alternating current applied to the AC connection.

According to a further aspect of the present invention, the mode-setting device is configured to predetermine the direction of power flow from the DC connection to the AC connection, and to predefine a second control pattern for the switching devices. This second control pattern provides that the first switching device and the third switching device are switched on the basis of the positive potential of an alternating current applied to the AC connection in order to permanently connect the bridge point of the corresponding bridge branch belonging to the switching device to the first DC contact during the associated half-wave, in particular, to switch through the corresponding switching device. In addition, the second control pattern provides that the second switching device or fourth switching device, which is not permanently switched during the half-wave, is operated with a clock pulse having a higher frequency than that of the alternating current applied to the AC connection.

This clock pulse may correspond to the frequency of a PWM (pulse width modulated) signal and, in the case of PFC operation or rectifier mode, adapt the current profile to the voltage profile of the generated alternating current, and/or the generated AC voltage by a DC voltage, and/or direct current with a high power factor or PFC value close to 1.

In inverter mode or feedback mode, this clock pulse may ensure that the DC voltage and/or the direct current can be converted into a ripple-free sinusoidal alternating current and/or a corresponding AC voltage.

According to one aspect of the present invention, the clock pulse is essentially independent of the direction of the power flow.

According to yet another aspect of the present invention, a computer-readable storage medium is provided on which a program code is stored which, when it is executed by a processor, carries out the method for operating an adapter device. A control device or a controller can use such a processor, in particular, a mode-setting device.

A floppy disk, a hard disk, a USB (universal serial bus) storage device, a RAM (random access memory), a ROM (read only memory), or an EPROM (erasable programmable read only memory) may be used as a computer-readable storage medium. An ASIC (application-specific integrated circuit) or an FPGA (field-programmable gate array), as well as an SSD (solid-state drive) technology or a flash-based storage medium, may also be used as storage media. A web server or a cloud storage can also be used as a storage medium. A communication network, such as the Internet, for example, which may allow program code to be downloaded, can also be viewed as a computer-readable storage medium. A radio-based network technology and/or a wired network technology can be used.

According to yet another aspect of the present invention, a program element is created having program code which, when it is executed by a processor, carries out the method for operating an adapter device.

According to yet another aspect of the present invention, a bridgeless PFC circuit may be provided having two boost converters. A boost converter may correspond to a bridge branch of the adapter device. The boost converters each have a series connection including a power switch or a second or fourth switching device and a diode each. The power switch is connected by means of its first connection to the negative pole of a DC voltage circuit and/or DC connection. The diode is connected to the cathode at the positive pole of the same DC circuit or intermediate circuit. In addition, each of the connection points between the second connection of the power switch and the diode anode is connected to a connection of a two-pole AC voltage source or the first or second AC contact via a respective choke. An IGBT or a first switching device or a second switching device is connected in parallel to each diode of each of the two boost converters, which is fully switched through when the inverter is in operation during the positive half-wave of the associated grid connection, in particular, bypassing and/or shorting the diode.

According to a further aspect of the present invention, the boost converter and/or the bridge branch has a MOSFET and a SiC diode, in particular, the boost converter and/or the bridge branch has a Si-MOSFET and a SiC diode.

BRIEF DESCRIPTION OF THE DRAWINGS

In the following, further embodiments of the present invention are described with reference to the drawings.

DETAILED DESCRIPTION

Figure 1:
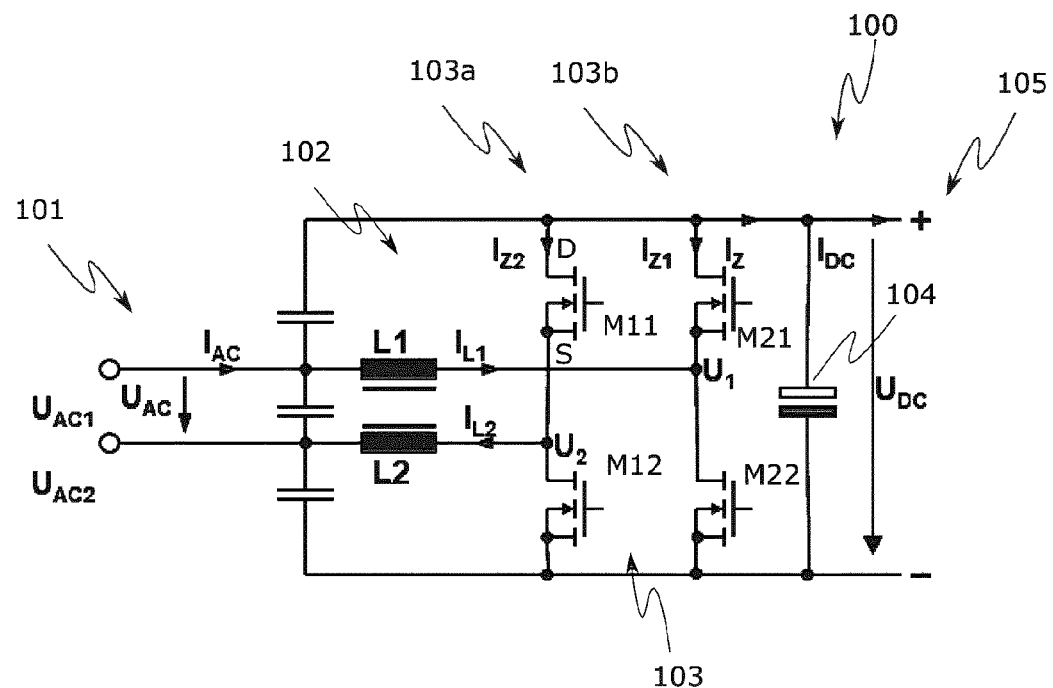
FIG. 1 shows a full-bridge PFC circuit for a better understanding of the present invention.

The representations in the drawings are schematic and not to scale. In the following description of FIGS. 1 to 7, the same reference signs are used for the same or corresponding elements.

In this text, the terms "capacitor" and "capacitance", as well as "coil" or "choke", and "inductance", may be used synonymously and should not be interpreted restrictively unless otherwise specified. In addition, the terms "energy" and "power" may be used interchangeably and should not be interpreted restrictively unless otherwise specified.

Unless explicitly stated, the terms "alternating current" and "AC voltage" or "direct current" and "DC voltage" may be used interchangeably and essentially describe the temporal profile of the physical quantity. Apart from that, usage depends on whether the phase position of the respective variables is important. For example, the terms "AC source" and "AC voltage source" or "DC source" and "DC voltage source" may imply that both a correspondingly shaped current and a correspondingly shaped voltage are described.

A PFC (power factor correction) circuit is often connected to a passive rectifier or a passive bridge between an AC voltage source, for example, the public AC grid and a DC voltage consumer, for example, a DC intermediate circuit with a capacitor and a downstream inverter with a transformer. Generally, the DC intermediate circuit with the capacitor and downstream inverter with transformer can be viewed as a "load." This part of the circuit, known as PFC, located between the bridge or the AC voltage source and the load, is usually designed as a boost converter and thus allows power to be drawn from the grid over the entire grid period, especially near the voltage zero crossing. The PFC is regulated in such a way that a sinusoidal alternating current is drawn from the AC grid.

The PFC circuit operated between the passive bridge and the load has a power switch, a coil, and a diode. An IGBT or a MOSFET can be used as an active power switch. IGBTs are cheaper, but they have greater switching losses than MOSFETs. In addition, by using a larger MOSFET, the voltage loss across the closed switch of the PFC circuit can theoretically be reduced as desired, which is not possible with IGBTs. Therefore, many high-efficiency PFC circuits use MOSFETs as power switches.

A PFC circuit is often only designed to convey power from an AC voltage source to a DC voltage consumer.

If a PFC circuit is to allow reverse power flow, i.e., from DC to AC, meaning from the "load" to the "grid," the load must be replaced by a DC voltage source, which is easily possible in the case of a rechargeable battery. However, all diodes that predetermine the direction of the power flow from AC to DC would also have to be made ineffective, which would be possible by bridging with active switches.

FIG. 1 shows a full-bridge PFC circuit 100 for a better understanding of the present invention. This has no passive rectifier bridge and is therefore actively switched over during the positive half-wave and the negative half-wave. Because of this active operation, no diodes are required that must be bridged. The full-bridge PFC circuit 100 can therefore be operated bidirectionally by operating as a PFC or as an inverter, depending on the direction of the current, which is done by appropriate control of the switches or switching devices $M_{11}$, $M_{12}$, $M_{21}$, $M_{22}$.

In PFC operation or rectifier operation, power is transmitted from the AC connection 101 from the AC side via the coil pair L1, L2 102 and the two bridge branches 103a, 103b, which form the full bridge 103 with the switching devices $M_{11}$, $M_{12}$, $M_{21}$, $M_{22}$, via the smoothing capacitor 104 to the DC connection 105 on the DC side.

In inverter operation, power is transmitted from the DC side 105 to the AC side.

The circuit arrangement shown in FIG. 1 is possible using Si-MOSFETs if the effective inductances L1, L2 are so small that the current in each half bridge 103a, 103b or each bridge branch 103a, 103b is directed during the switching process of the switching devices $M_{11}$, $M_{12}$, $M_{21}$, $M_{22}$ in such a way that the voltage commutates when switching off the respective switching device $M_{11}$, $M_{12}$, $M_{21}$, $M_{22}$ implemented as MOSFETs, i.e., the current changes sign with every switching operation of a switching device $M_{11}$, $M_{12}$, $M_{21}$, $M_{22}$ and flows from drain to source of the corresponding MOSFETs $M_{11}$, $M_{12}$, $M_{21}$, $M_{22}$ immediately before switching off.

Otherwise, the current from source to drain would continue to flow through the internal diode or body diode (not shown in FIG. 1) of the MOSFET, and a "forced commutation" would occur when the opposite MOSFET of the same half bridge 103a, 103b is switched on. Due to the high reverse recovery time of the body diode, this process would lead to high losses and strong electromagnetic interference.

In order to avoid these undesirable effects, the PFC circuit 100 has only low inductances in the PFC chokes L1, L2. These low inductances lead to high current ripples both in PFC operation and in inverter operation, which is why the high-frequency AC component that is superimposed on the AC voltage generated at the PFC input 101 is very large. These current ripples would have to be kept away from the actual grid input 105, i.e., the DC connection 105, with complex filters, or partially compensated for by using two parallel PFC converters, possibly with coupled chokes that clock out of phase.

Figure 2:
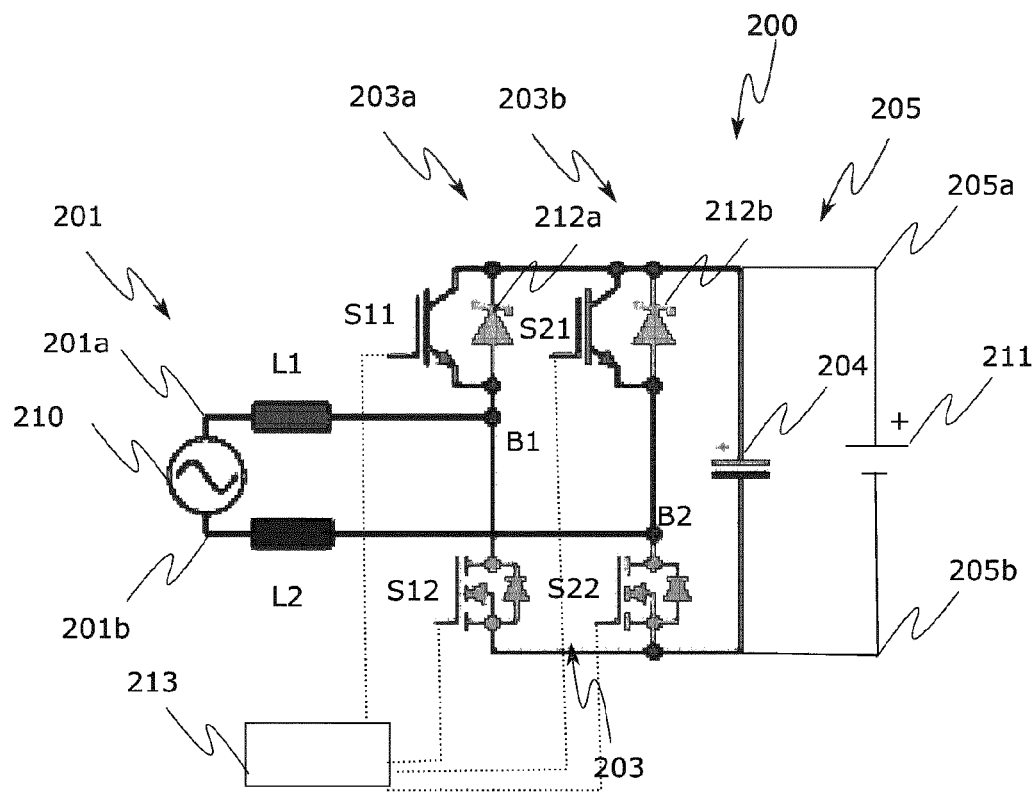
FIG. 2 shows an adapter device according to one embodiment of the present invention.

In order to reduce the circuit complexity for reverse operation, an adapter device 200 according to FIG. 2 is proposed.

The adapter device 200 for connecting an AC device 210 and a DC device 211 includes an AC connection 201, a DC connection 205, a first bridge branch 203a, a second bridge branch 203b, and a mode-setting device 213. The first bridge branch 203a and the second bridge branch 203b form a full-bridge circuit 203.

The first bridge branch 203a also has a first switching device $S_{11}$ and a second switching device $S_{12}$. The second bridge branch 203b has a third switching device $S_{21}$ and a fourth switching device $S_{22}$.

The first switching device $S_{11}$ is connected in series to the second switching device $S_{12}$ at a first bridge point B1, and the third switching device $S_{21}$ is connected in series to the fourth switching device $S_{22}$ at a second bridge point B2.

The first bridge point B1 is connected to a first AC contact 201a of the AC connection 201, and the second bridge point B2 is connected to a second AC contact 201b of the AC connection.

The first bridge branch 203a and the second bridge branch 203b are connected in parallel to a first DC contact 205a, or a first DC bus 205a of the DC connection 205, or to a second DC contact 205b, or a second DC bus 205b of the DC connection 205.

The switching devices $S_{11}$, $S_{12}$, $S_{21}$, $S_{22}$ are connected to the mode-setting device 213, and the mode-setting device 213 is configured to predetermine the direction of power flow between the DC connection 205 and/or the AC connection 201.

Different types of switching devices are used as switching devices $S_{11}$, $S_{12}$, $S_{21}$, $S_{22}$ of a bridge branch 203a, 203b. For example, the type of the first switching device $S_{11}$ of the first bridge branch 203a differs from the type of the second switching device $S_{12}$ of the first bridge branch 203a. Likewise, for example, the type of the third switching device $S_{12}$ of the second bridge branch 203b differs from the type of the fourth switching device $S_{12}$ of the second bridge branch 203b.

A first diode 212a can be provided anti-parallel to the first switching device $S_{11}$, and a second diode 212b can be provided anti-parallel to the third switching device $S_{21}$.

The type of the first diode 212a and the second diode 212b can be a SiC diode. The type of the second switching device $S_{12}$ and the fourth switching device $S_{22}$ are Si-MOSFETs. In order to avoid the requirement of small inductances for the coils L1, L2 or the high ripple currents, SiC-MOSFETs, the body diode of which has essentially no reverse delay, could be used instead of Si-MOSFETs for the second switching device $S_{12}$ and the fourth switching device $S_{22}$. However, SiC-MOSFETs are significantly more expensive than Si-MOSFETs. Si-MOSFETs essentially always have a body diode. However, the adapter device 200 or the PFC 200 from FIG. 2 allows bidirectional operation, despite the use of conventional Si-MOSFETs as the second switching device $S_{12}$ and fourth switching device $S_{22}$. In contrast to the price difference between SiC-MOSFETs and Si-MOSFETs, the extra cost of SiC diodes compared to Si diodes is not as great.

The adapter device 200 can consequently be operated as a bidirectional bridgeless PFC. The term "bridgeless" may refer to a passive rectifier bridge. Switches with majority charge carriers are MOSFETs or SiC diodes, which are actually SiC Schottky diodes, and switches with minority charge carriers are IGBTs or conventional Si diodes. By using SiC diodes 212a, 212b, reverse recovery losses of almost zero in the switching frequency range>>100 kHz of the switching devices $S_{11}$, $S_{12}$, $S_{21}$, $S_{22}$ can be achieved in a continuous current mode (CCM), i.e., if the current does not return to zero, despite the use of Si-MOSFETs as the second switching device $S_{12}$ and the fourth switching device $S_{22}$.

IGBTs can be used for the first switching device $S_{11}$ and the third switching device $S_{21}$. The use of IGBTs allows inverter mode, i.e., power flow from the DC side 205 to the AC side 201. If this power flow direction is not needed at all, the IGBTs can be omitted or not fitted.

In the following, different phases of a positive and negative half-wave of a sinusoidal current curve both in rectifier mode and in inverter mode are considered.

The adapter device has two half bridges 203a, 203b, wherein the first switching device $S_{11}$ and the third switching device $S_{21}$ in FIG. 2 are each connected to the upper contact of the DC connection 205 based on the orientation in FIG. 2. The upper contact 205a is the contact that is connected to the positive pole of the DC voltage source 211. One bridge branch 203a, 203b of the bridge 203 results as a parallel connection of a slowly switching IGBT $S_{11}$, $S_{21}$ and a SiC diode 212a, 212b that switches faster than the switching speed of the IGBT $S_{11}$, $S_{21}$. Normal Si-MOSFETs are used in the third and fourth switching devices. The various switching devices can be differentiated, for example, in that majority charge carriers or minority charge carriers are used for charge transport. When using majority charge carriers, there is essentially no switch-off delay, whereas when using minority charge carriers, greater switch-off delays occur, which are noticeable.

Figure 3:
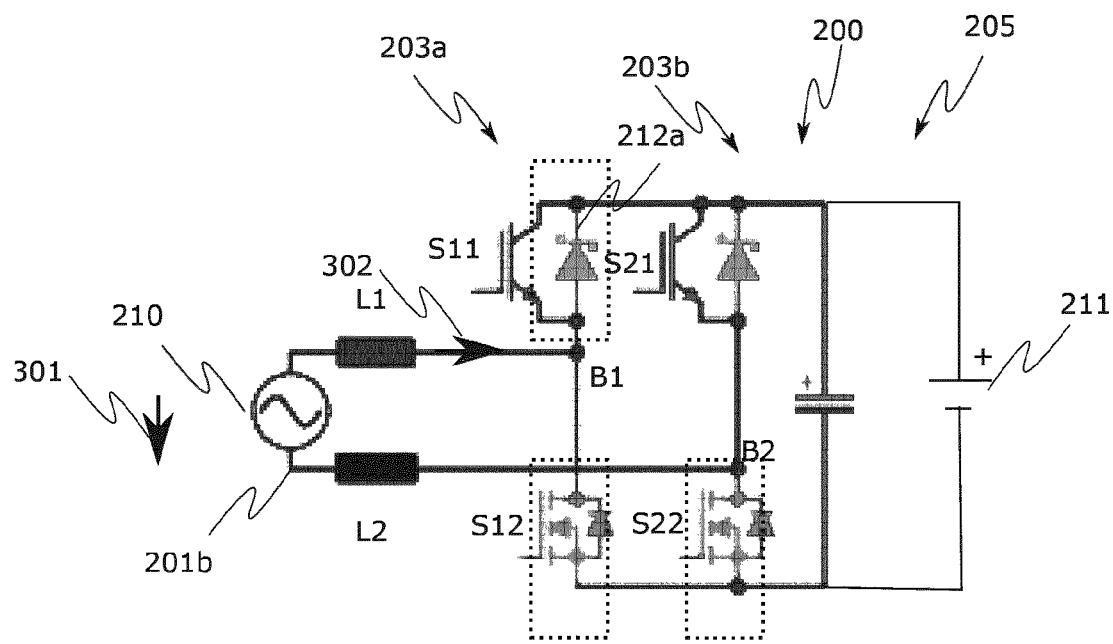
FIG. 3 shows the adapter device in rectifier mode during the application of a positive half-wave of a sinusoidal AC voltage provided by the grid according to one embodiment of the present invention.

FIG. 3 shows the adapter device 200 in PFC mode or rectifier mode during the application of a positive half-wave of a sinusoidal AC voltage provided by the grid 210 according to one embodiment of the present invention. The polarity of the AC input voltage is shown by arrow 301. The direction of the alternating current is shown by current arrow 302. In addition, the components that are important in this phase are marked by rectangles. These are the two Si-MOSFET switching devices $S_{12}$, $S_{22}$ and the SiC diode 212a. The control pattern for the second switching device $S_{12}$ and the fourth switching device $S_{22}$ is configured by the mode-setting device 213 (not shown in FIG. 3) on the basis of the voltage direction and current direction on the AC side 201. To detect the current and voltage direction, the mode-setting device 213 uses sensors that are not shown in FIG. 3.

For the duration of a grid sinusoidal half-wave with a positive sign, that MOSFET is switched through by means of the mode-setting device 213, the bridge point B2 of which is connected via the choke L2 to the grid input 201b, which is currently passing through the negative half-wave of the sinusoidal voltage. In other words, whose bridge point is connected to the negative potential of the half-wave. The other half bridge 203a, the bridge point B1 of which is connected to the currently positive grid connection via the second choke L1, is operated as a "clocking" half bridge 203a and which alternately switches the first switching device $S_{11}$ and the second switching device $S_{12}$ on and off in time with a PWM signal.

A voltage of around 15 V with respect to the MOSFET source or the IGBT emitter can be used for control. In one example, the clock pulse may relate to the PWM frequency of 100 kHz or more, with a cycle time of 10 μs or less. On the other hand, in one example, the approximately thousand times longer switch-on time during a 10 ms grid sinusoidal half-wave can be viewed as "fully switched through."

The IGBTs allow the flow of current from the DC source 211 to the AC source 210 and are not used, deactivated, or switched on in "rectifier mode."

In other words, the mode-setting device is configured to predetermine the direction of power flow from the AC connection to the DC connection 205, to switch the second switching device $S_{12}$ and the fourth switching device $S_{22}$ on the basis of the negative potential of an alternating current applied to the AC connection in order to permanently connect the bridge point of the corresponding bridge branch belonging to the switching device to the second DC connection during the associated half-wave. The second switching device $S_{12}$ or fourth switching device $S_{22}$, which is not permanently switched during the half-wave, is operated with a clock pulse having a higher frequency than that of the alternating current applied to the AC connection.

In FIG. 3, the arrowhead of arrow 301, which indicates the negative potential, lies on the AC contact 201b and thus on bridge point B2. Bridge point B2 belongs to the second bridge branch 203b. The fourth switching device $S_{22}$ is thus switched through for the duration of the negative potential present, so that the bridge point B2 is connected to the negative DC contact 205b of the DC connection 205. The second switching device $S_{12}$ of the bridge branch, which is correspondingly connected to the negative DC contact 205b, can be freely switched and can therefore be clocked. Bridge point B1 is assigned to the positive potential of the half-wave 301.

Figure 4:
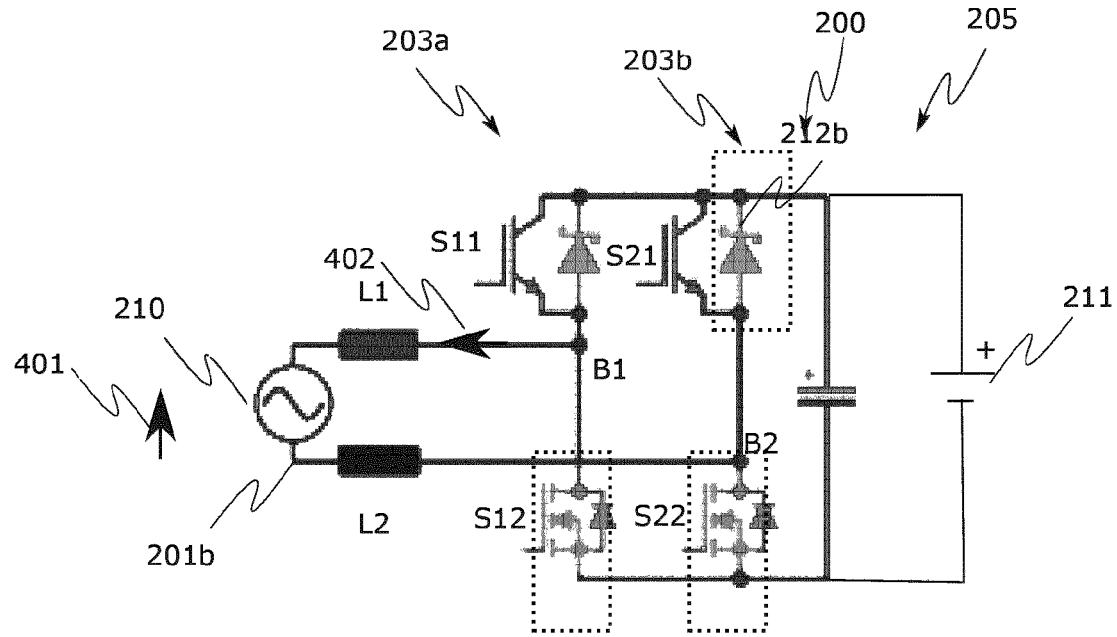
FIG. 4 shows the adapter device in rectifier mode during the application of a negative half-wave of a sinusoidal AC voltage provided by the grid according to one embodiment of the present invention.

FIG. 4 shows the adapter device 200 in PFC mode or rectifier mode during the application of a negative half-wave of a sinusoidal AC voltage provided by the grid 210 according to one embodiment of the present invention.

The polarity of the AC input voltage is shown by arrow 401. The direction of the alternating current is shown by current arrow 402. Both current and voltage are in the opposite direction from FIG. 3. In addition, the components that are important in this phase are marked by rectangles. These are the two Si-MOSFET switching devices $S_{12}$, $S_{22}$ and the SiC diode 212b. The control pattern for the second switching device $S_{12}$ and the fourth switching device $S_{22}$ is configured by the mode-setting device 213 (not shown in FIG. 3) on the basis of the voltage direction and current direction on the AC side 201. To detect the current and voltage direction, the mode-setting device 213 uses sensors that are not shown in FIG. 3.

Since the first bridge point B1 has the negative potential of the voltage 401, the second switching device $S_{12}$ belonging to the associated first bridge branch 203a is switched through for the duration of the half-wave and connected to the negative DC contact 205b of the DC connection 205. The fourth switching device $S_{22}$ is clocked.

By switching between the control patterns of FIG. 3 and FIG. 4, it is essentially taken into account that the circuit does not have a passive rectifier bridge, so that the passive rectifier bridge functions by actively switching on the basis of the polarity of the AC input voltage.

Figure 5:
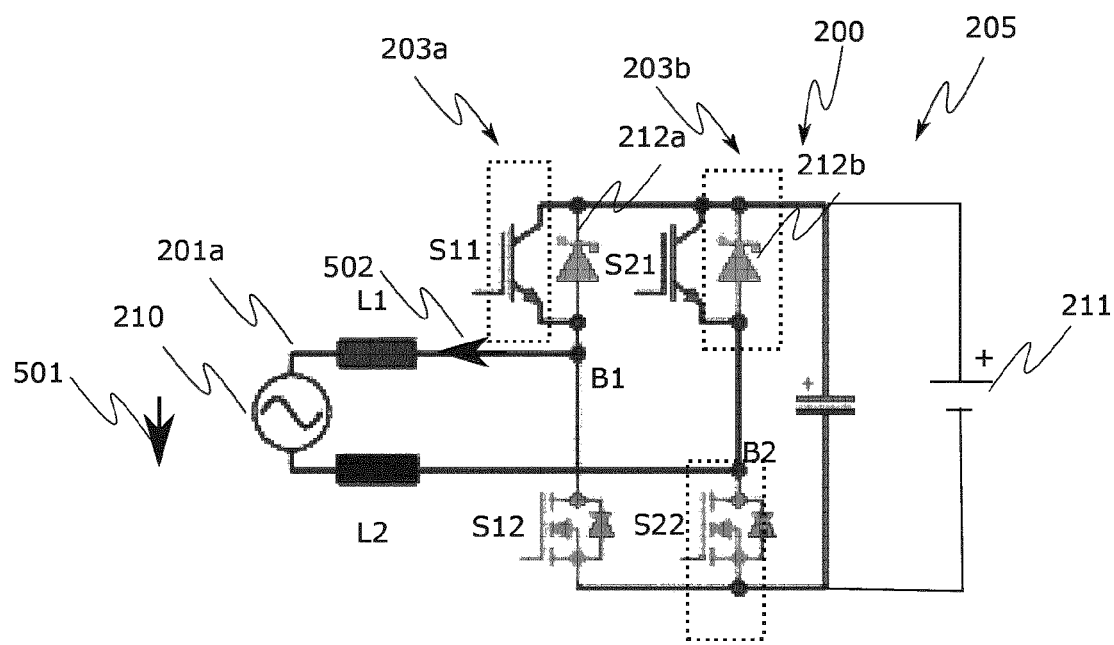
FIG. 5 shows the adapter device in inverter mode during the provision of a positive half-wave of a sinusoidal-generated AC voltage according to one embodiment of the present invention.

FIG. 5 shows the adapter device 200 in inverter mode during the provision of a positive half-wave of a sinusoidal-generated AC voltage according to one embodiment of the present invention. In feedback operation or inverter mode, the IGBTs $S_{11}$, $S_{21}$ are used to allow an energy flow and/or power flow from the DC circuit into the AC circuit, in particular, to connect the DC side 205 to the AC side 201. For the duration of a grid sinusoidal half-wave, represented by arrow 501, the IGBT $S_{11}$ whose bridge point B1 is connected via the associated choke, for example L1, to the grid input or AC contact 201a, which is currently passing through the positive half-wave of the sinusoidal voltage, is fully switched through. The other half bridge 203b, which is connected to the currently negative grid connection 201b via the second choke, for example L2, is connected to the "clocking" half bridge, in particular, the half bridge clocked with PWM, which clocks according to the examples from FIG. 3 and FIG. 4. In inverter mode, the power flows in the opposite direction to rectifier mode from the DC side 205 to the AC side 201.

In other words, the mode-setting device 213 is configured to predetermine the direction of power flow from the DC connection 205 to the AC connection 201 by configuring a switch-on pattern. In FIG. 5, the positive potential of the generated AC voltage 501 is applied to the bridge point B1, so that the first switching device $S_{11}$ is actuated. While the associated half-wave 501 is present, $S_{11}$ is switched in such a way that the bridge point of the corresponding bridge branch 203a belonging to the switching device $S_{11}$ is permanently connected to the first DC connection 205a. The fourth switching device $S_{22}$, which is not permanently switched during the half-wave, is operated with a clock pulse having a higher frequency than that of the alternating current applied to the AC connection.

Figure 6:
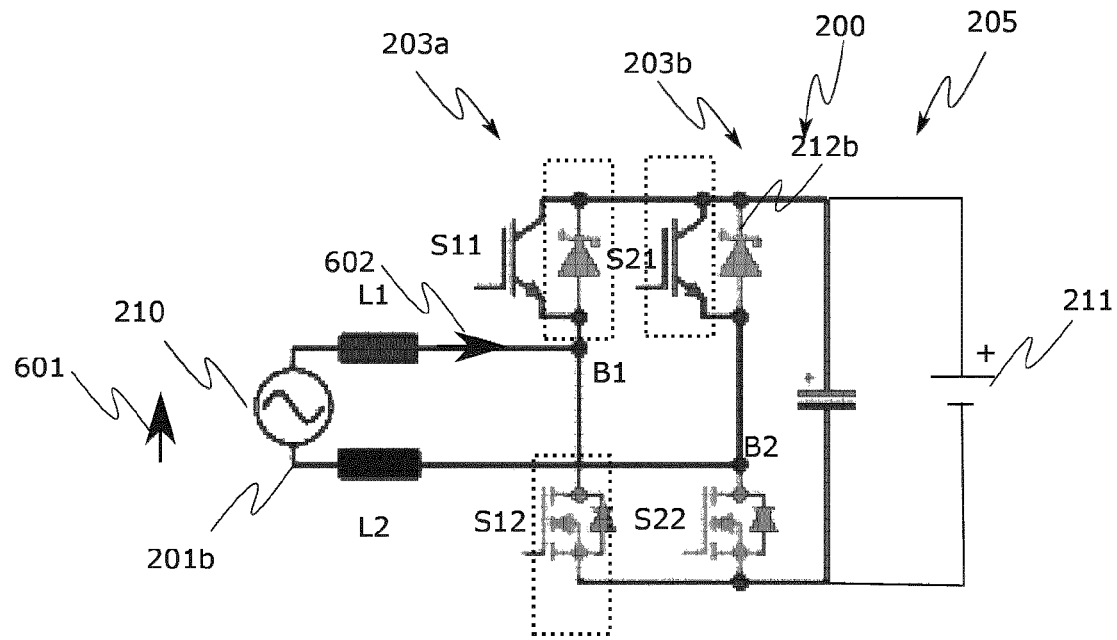
FIG. 6 shows the adapter device in inverter mode during the provision of a negative half-wave of a sinusoidal-generated AC voltage according to one embodiment of the present invention.

FIG. 6 shows the adapter device 200 in inverter mode during the provision of a negative half-wave of a sinusoidal-generated AC voltage according to one embodiment of the present invention.

The mode-setting device 213 is configured to predetermine the direction of power flow from the DC connection 205 to the AC connection 201, to switch the third switching device $S_{21}$ on the basis of the positive potential of an alternating current applied to the AC connection in order to permanently connect the bridge point B2 of the corresponding bridge branch 203b belonging to the third switching device $S_{21}$ to the first DC connection 205a during the associated half-wave. The second switching device $S_{12}$, which is not permanently switched during the half-wave 601, is operated with a clock pulse having a higher frequency than that of the alternating current applied to the AC connection.

In one example, when feedback operation is not required, the IGBTs S11, S21 do not have to be fitted. For example, single or multi-phase chargers can be produced, with only some of the phases being equipped to be capable of energy recovery.

Figure 7:
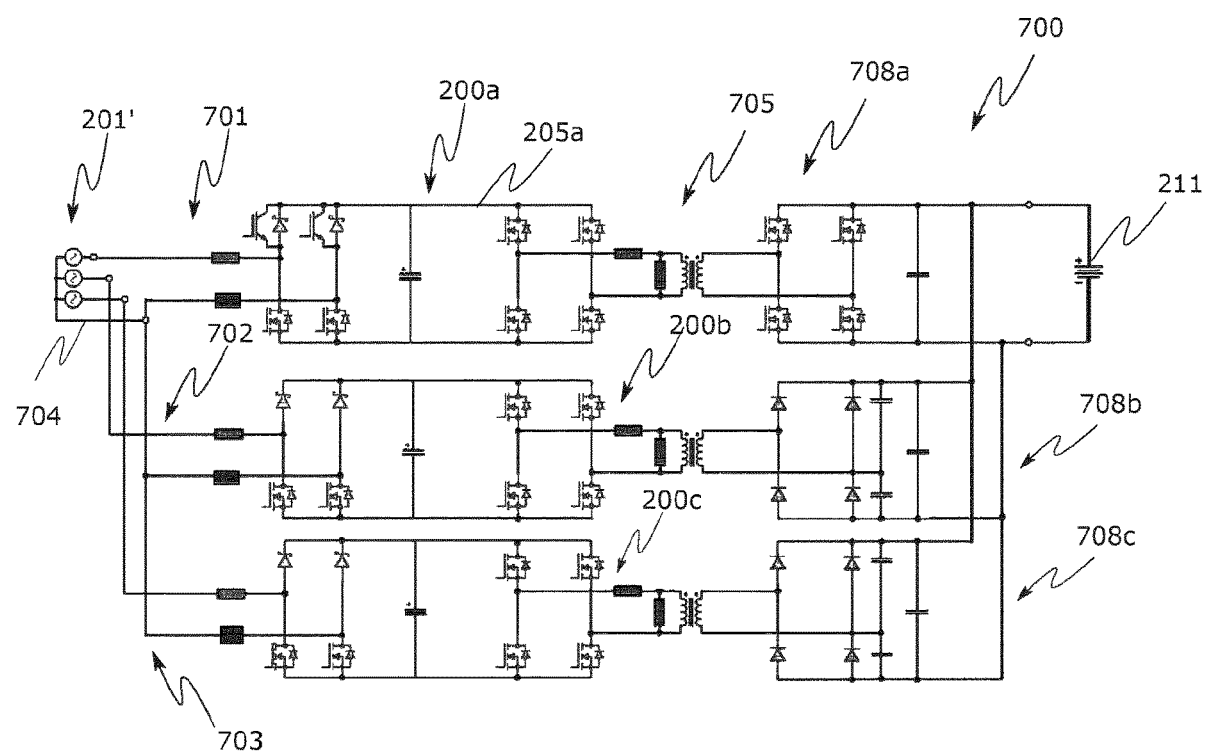
FIG. 7 shows an energy supply system with a three-phase structure for an electric vehicle according to one embodiment of the present invention.

FIG. 7 shows an energy supply system 700 with a three-phase structure for an electric vehicle according to one embodiment of the present invention. The energy supply system 700 or the three-phase charger is only equipped for single-phase inverse power flow. For this purpose, a fully-equipped adapter device 200a is provided in the first phase 701. For the second phase 702 and third phase 703, only one partially-equipped adapter device 200b, 200c is used, in which IGBTs are not fitted.

A PFC 200a, 200b, 200c is connected between each of the three phases 701, 702, 703 and the common neutral conductor 704, each with a MOSFET inverter stage and a downstream transformer 705 as a "load." The secondary side of the transformers is connected to the battery of the electric vehicle via a rectifier 708a, 708b, 708c. The top of the rectifiers 708a is designed with active switches, for example, MOSFETs, which allows energy to flow from the battery 211 back to the PFC stage 200a. The topmost of the three PFC stages 200a is also capable of energy recovery with the two IGBTs on the positive pole 205a of the intermediate circuit. This circuit thus allows energy to be drawn from the three-phase grid 201' for charging the vehicle. When driving or parked, the system can provide a single-phase AC voltage for normal grid consumers, e.g., tools, lamps, household appliances. With a suitable design, an application for vehicle-to-grid power supply is also conceivable, be it to support the grid at high loads or to supply one's own household with electricity. Of course, two or all three phases can also be bidirectional.

In addition, it should be pointed out that "comprising," "including," and "having" do not exclude any other elements or steps, and that "a" or "an" does not exclude a plurality. It should also be noted that features or steps that have been described with reference to one of the above embodiments can also be used in combination with other features or steps of other embodiments described above. Reference signs in the claims are not to be regarded as a limitation.

The invention claimed is:

1. An energy supply system comprising a three-phase structure for an electric vehicle, wherein the energy supply system comprises:
    an AC source and/or an AC socket;
    a DC source and/or a DC storage device;
    a first adapter device in a first phase of the three-phase structure, wherein the first adapter device comprises:
        an AC connection comprising a first AC contact and a second AC contact, the first AC contact and the second AC contact connected to the AC source and/or the AC socket;
        a DC connection comprising a first DC contact and a second DC contact, the first DC contact and the second DC contact connected to the DC source and/or the DC storage device;
        a first bridge branch comprising a first switching device and a second switching device, the first switching device connected in series to the second switching device at a first bridge point, the first bridge point connected to the first AC contact of the AC connection;
        a second bridge branch comprising a third switching device and a fourth switching device, the third switching device is connected in series to the fourth switching device at a second bridge point, the second bridge point connected to the second AC contact of the AC connection; and
        a mode-setting device configured to predetermine a direction of power flow between the AC connection and/or the DC connection, wherein the first bridge branch and the second bridge branch are connected in parallel to the first DC contact and the second DC contact of the DC connection, and wherein each branch of the first bridge branch and the second bridge branch includes different types of switching devices comprising insulated-gate bipolar transistor (IGBT), metal-oxide-semiconductor field-effect transistor (MOSFET), and silicon carbide (SiC) diode, or IGBT, silicon metal-oxide-semiconductor field-effect transistor (Si-MOSFET), and SiC diode;
    a second adapter device in a second phase of the three-phase structure, wherein the second adapter device comprises:
        a second AC connection comprising a third AC contact and a fourth AC contact, the third AC contact and the fourth AC contact connected to the AC source and/or the AC socket;
        a second DC connection comprising a third DC contact and a fourth DC contact, the third DC contact and the fourth DC contact connected to the DC source and/or the DC storage device;
        a third bridge branch comprising a fifth switching device and a first diode, the fifth switching device connected in series to the first diode at a third bridge point, the third bridge point connected to the third AC contact of the second AC connection;
        a fourth bridge branch comprising a sixth switching device and a second diode, the sixth switching device connected in series to the second diode at a fourth bridge point, the fourth bridge point connected to the fourth AC contact of the AC connection, wherein the third bridge branch and the fourth bridge branch are connected in parallel to the first DC contact and the second DC contact of the DC connection, and wherein a switching device of each of the third bridge branch and the fourth bridge branch comprises no IGBT; and
    a third adapter device in a third phase of the three-phase structure, wherein the third adapter device comprises:
        a third AC connection comprising a fifth AC contact and a sixth AC contact, the fifth AC contact and the sixth AC contact connected to the AC source and/or the AC socket;
        a third DC connection comprising a fifth DC contact and a sixth DC contact, the fifth DC contact and the sixth DC contact connected to the DC source and/or the DC storage device;
        a fifth bridge branch comprising a seventh switching device and a third diode, the seventh switching device connected in series to the third diode at a fifth bridge point, the fifth bridge point connected to the fifth AC contact of the third AC connection;
        a sixth bridge branch comprising an eighth switching device and a fourth diode, the eighth switching device connected in series to the fourth diode at a sixth bridge point, the sixth bridge point connected to the sixth AC contact of the third AC connection, wherein the fifth bridge branch and the sixth bridge branch are connected in parallel to the first DC contact and the second DC contact of the DC connection, and wherein a switching device of each of the fifth bridge branch and the sixth bridge branch comprises no IGBT.

2. The energy supply system according to claim 1, wherein the mode-setting device is configured to predetermine the direction of the power flow between the DC connection and/or the AC connection in order to control the first switching device, the second switching device, the third switching device, and the fourth switching device according to a predeterminable pattern.

3. The energy supply system according to claim 1, wherein the different types of switching devices within each bridge branch of the first adapter device differ in terms of their switch-off losses and/or their switching speed.

4. The energy supply system according to claim 1, wherein the first AC contact and/or the second AC contact of the AC connection has/have a coil.

5. The energy supply system according to claim 1, wherein the mode-setting device is configured to:
    predetermine the direction of power flow from the AC connection to the DC connection, to switch the second switching device and the fourth switching device based on a negative potential of an alternating current applied to the AC connection in order to permanently connect a bridge point of a corresponding bridge branch belonging to a switching device to the second DC contact during an associated half-wave; and
    operate the second switching device or the fourth switching device, which is not permanently switched during the half-wave, with a clock pulse having a higher frequency than that of the alternating current applied to the AC connection.

6. The energy supply system according to claim 1, wherein the mode-setting device is configured to:
    predetermine the direction of power flow from the DC connection to the AC connection, to switch the first switching device and the third switching device based on a positive potential of an alternating current applied to the AC connection in order to permanently connect a bridge point of a corresponding bridge branch belonging to a switching device to the first DC contact during an associated half-wave; and operate the second switching device or the fourth switching device, which is not permanently switched during the half-wave, with a clock pulse having a higher frequency than that of the alternating current applied to the AC connection.

7. The energy supply system according to claim 5, wherein the clock pulse is independent of the direction of power flow.

8. The energy supply system according to claim 6, wherein the clock pulse is independent of the direction of power flow.

* * * * *